(12) United States Patent
Shieh et al.

(10) Patent No.: US 8,866,260 B2
(45) Date of Patent: Oct. 21, 2014

(54) MIM DECOUPLING CAPACITORS UNDER A CONTACT PAD

(75) Inventors: Hau-Tai Shieh, Hsin-Chu (TW); Chen-Hui Hsieh, Feng-Shan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 772 days.

(21) Appl. No.: 12/617,314

(22) Filed: Nov. 12, 2009

(65) Prior Publication Data

US 2010/0219502 A1  Sep. 2, 2010

Related U.S. Application Data

(60) Provisional application No. 61/156,281, filed on Feb. 27, 2009.

(51) Int. Cl.
| | | |
|---|---|---|
| *H01L 21/02* | (2006.01) | |
| *H01L 23/522* | (2006.01) | |
| *H01L 23/00* | (2006.01) | |
| *H01L 49/02* | (2006.01) | |
| *H01L 27/02* | (2006.01) | |

(52) U.S. Cl.
CPC ....... *H01L 24/06* (2013.01); *H01L 2924/01023* (2013.01); *H01L 2924/01042* (2013.01); *H01L 2924/01005* (2013.01); *H01L 2224/05093* (2013.01); *H01L 2924/01072* (2013.01); *H01L 2924/01029* (2013.01); *H01L 2924/01075* (2013.01); *H01L 2924/01019* (2013.01); *H01L 2224/05624* (2013.01); *H01L 2924/01327* (2013.01); *H01L 2924/14* (2013.01); *H01L 2924/01044* (2013.01); *H01L 2924/01022* (2013.01); *H01L 2924/01014* (2013.01); *H01L 2224/05647* (2013.01); *H01L 2924/01078* (2013.01); *H01L 2924/01028* (2013.01); *H01L 23/5223* (2013.01); *H01L 2924/04953* (2013.01); *H01L 24/05* (2013.01); *H01L 2924/01033* (2013.01); *H01L 2924/01057* (2013.01); *H01L 28/40* (2013.01); *H01L 2224/05681* (2013.01);

(Continued)

(58) Field of Classification Search
CPC .................. H01l 28/40–28/92; H01l 23/5223
USPC .................................. 257/532, 533, 535, 534
See application file for complete search history.

(56) References Cited

U.S. PATENT DOCUMENTS

| | | |
|---|---|---|
| 5,652,689 A | 7/1997 | Yuan |
| 5,838,043 A | 11/1998 | Yuan |

(Continued)

FOREIGN PATENT DOCUMENTS

CN  1487583 A  4/2004

*Primary Examiner* — Matthew W Such
*Assistant Examiner* — Scott Stowe
(74) *Attorney, Agent, or Firm* — Slater & Matsil, L.L.P.

(57) ABSTRACT

An integrated circuit structure includes one or more external contact pads with decoupling capacitors, such as metal-insulator-metal (MIM) capacitors, formed directly thereunder. In an embodiment, the decoupling capacitors are formed below the first metallization layer, and in another embodiment, the decoupling capacitors are formed in the uppermost inter-metal dielectric layer. A bottom plate of the decoupling capacitors is electrically coupled to one of $V_{dd}$ and $V_{ss}$, and the top plate of the decoupling capacitors is electrically coupled to the other. The decoupling capacitors may include an array of decoupling capacitors formed under the external contact pads and may include one or more dummy decoupling capacitors. The one or more dummy decoupling capacitors are MIM capacitors in which at least one of the top plate and the bottom plate is not electrically coupled to an external contact pad.

20 Claims, 12 Drawing Sheets

(52) U.S. Cl.
CPC ............... *H01L 2224/05666* (2013.01); *H01L 2924/01027* (2013.01); *H01L 2924/01013* (2013.01); *H01L 27/0207* (2013.01); *H01L 2924/0104* (2013.01); *H01L 2924/01073* (2013.01); *H01L 2924/04941* (2013.01); *H01L 2924/30105* (2013.01); *H01L 2924/19041* (2013.01); *H01L 2924/05042* (2013.01); *H01L 2924/0105* (2013.01); *H01L 2924/01007* (2013.01); *H01L 2924/01074* (2013.01); *H01L 2924/01025* (2013.01)
USPC ............ 257/532; 257/534; 438/381; 438/396

(56) References Cited

U.S. PATENT DOCUMENTS

| | | | | |
|---|---|---|---|---|
| 6,876,059 | B2* | 4/2005 | Sano | 257/532 |
| 6,921,977 | B2 | 7/2005 | Shimizu et al. | |
| 7,462,912 | B2* | 12/2008 | Ahn et al. | 257/334 |
| 2003/0001284 | A1* | 1/2003 | List et al. | 257/778 |
| 2003/0089943 | A1* | 5/2003 | Duncombe et al. | 257/310 |
| 2003/0185068 | A1* | 10/2003 | Saito et al. | 365/200 |
| 2004/0002187 | A1* | 1/2004 | Block et al. | 438/238 |
| 2010/0148304 | A1* | 6/2010 | Rahim et al. | 257/532 |

* cited by examiner

MIM DECOUPLING CAPACITORS UNDER A CONTACT PAD

This application claims the benefit of U.S. Provisional Application Ser. No. 61/156,281, filed on Feb. 27, 2009, entitled "MIM Decoupling Capacitors under a Contact Pad," which application is hereby incorporated herein by reference.

TECHNICAL FIELD

This invention relates generally to semiconductor devices and, more particularly, to semiconductor devices having metal-insulator-metal (MIM) capacitors positioned directly under an external contact pad.

BACKGROUND

Capacitors are used in semiconductor devices for a variety of purposes in a variety of functional circuits, such as mixed signal circuits, analog circuits, radio frequency (RF) circuits, dynamic random access memory (DRAM), embedded DRAM (eDRAM), and logic operation circuits. One purpose for which a capacitor is used is as a decoupling capacitor, wherein the decoupling capacitor is placed between power contacts to eliminate or reduce noise on the power lines, thereby preventing power spikes on the power lines from damaging other circuitry.

In an attempt to incorporate the decoupling capacitor with the other circuitry, the decoupling capacitor has been placed on-chip. One attempt at using an on-chip decoupling capacitor utilizes a thin-film planar capacitor. These capacitors, however, generally require large areas and are difficult to design and fabricate such that the capacitors have a sufficiently large enough capacitance.

In an attempt to increase the capacitance of the decoupling capacitor, metal-insulator-metal (MIM) capacitors have been used. MIM capacitors comprise metallic layers with a dielectric layer interposed therebetween formed in a trench of a dielectric layer. Placing the MIM coupling capacitors on-chip, however, is limited by the amount of area and the routing lines. For example, the MIM decoupling capacitors may require a significant amount of space and care must be taken regarding the placement. As a result, the resulting chip size is increased.

Accordingly, what is needed in the art are schemes for integrating decoupling MIM capacitors on a chip that requires less overall chip area.

SUMMARY OF THE INVENTION

These and other problems are generally reduced, solved or circumvented, and technical advantages are generally achieved, by embodiments of the present invention which provide decoupling MIM capacitors directly under external contact pads.

In accordance with an embodiment of the present invention, an integrated circuit structure is provided. The integrated circuit structure includes a chip having an external contact pad. One or more decoupling MIM capacitors are placed directly under the external contact pad. Additionally, one or more dummy decoupling MIM capacitors may be included.

In accordance with another embodiment of the present invention, an integrated circuit structure is provided. The integrated circuit structure includes a substrate having a plurality of dielectric layers formed thereon. One or more effective MIM capacitors are formed in the plurality of dielectric layers. A first plate of the MIM capacitors is electrically coupled to one of $V_{ss}$ or $V_{dd}$, while the other plate is electrically coupled to the other one of $V_{ss}$ and $V_{dd}$. An external contact pad is formed over the one or more effective MIM capacitors. Additionally, one or more dummy decoupling MIM capacitors may be included.

In accordance with yet another embodiment of the present invention, a method of forming an integrated circuit device is provided. The method includes providing a substrate and forming a plurality of dielectric layers over the substrate. One or more metallization layers are formed between adjacent ones of the plurality of dielectric layers. A plurality of effective decoupling MIM capacitors is formed in at least one of the plurality of dielectric layers. An external contact pad is formed directly over the plurality of effective decoupling capacitors. Additionally, one or more dummy decoupling MIM capacitors may be included.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an integrated capacitor compatible with standard semiconductor processing techniques used to fabricate eDRAMs and mixed signal/RF applications. The invention may also be applied, however, to other designs in which it is desirable to integrate capacitors with other semiconductor devices and designs such as other signal processing and system-on-chip applications.

Figure 1:
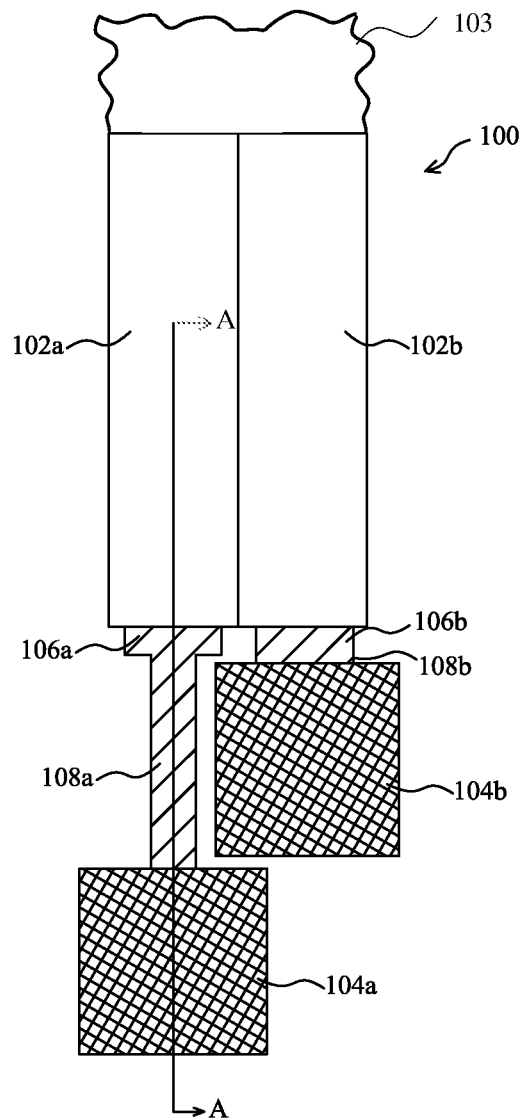
FIG. 1 is a plan view of contact pads in accordance with an embodiment of the present invention.

Referring first to FIG. 1, a plan view of a bond pad arrangement relative to circuitry on a semiconductor die is shown in accordance with an embodiment of the present invention. In particular, FIG. 1 shows a top view of a portion of a semiconductor die 100, wherein bond pads 104a and 104b are positioned in a traditional bond pad pattern. The semiconductor die 100 includes a plurality of input/output cells 102a and 102b formed in an upper layer of the semiconductor die 100. The input/output cells 102a and 102b are electrically coupled to active areas within a semiconductor substrate (partially illustrated in FIGS. 2-5). The active areas may reside beneath the input/output cells 102a and 102b, or they may be coupled to the input/output cells 102a and 102b using conductive lines beneath or located to the side of the input/output cells 102a and 102b, for example.

It should be noted that the bond pad pattern illustrated in FIG. 1 is a staggered bond pad pattern, but that other embodiments may utilize any bond pad pattern suitable for the particular purpose. In this embodiment, the bond pads 104a and 104b are staggered and are disposed to the side of the input/output cells 102a and 102b, as shown. The bond pads 104a and 104b are typically coupled to the input/output cells 102a and 102b, respectively, by one or more conductive pins 106a/108a and 106b/108b, respectively. Conductive pins 108a and 108b typically are formed in the same interconnect layer that the bond pads 104a and 104b are formed in, while conductive pins 106a and 106b may partially reside in a via layer, for example.

As will be discussed in greater detail below, a metal-insulator-metal (MIM) decoupling capacitor array is formed beneath the bond pads 104a and 104b. The area under the bond pads provides a substantial amount of area that may be utilized by a MIM decoupling capacitor array, thereby allowing the overall size of the chip to be reduced. It should be noted, however, that not all of the area under all of the contact pads may be used, dependent upon the design and electrical characteristics of the circuit. For example, due to the close proximity of other circuitry and other performance concerns, it may be desirable to not place a MIM decoupling capacitor array under some contact pads.

FIGS. 2-5 are cross-sectional views taken along the A-A line in FIG. 1 and illustrate various intermediate processing steps in accordance with an embodiment of the present invention. While the description included herein refers to the semiconductor die 100, one of ordinary skill in the art will realize that the processes apply equally to a semiconductor wafer. The semiconductor die 100 includes a substrate 210 having an input/output region 212 and a pad region 214. The semiconductor die 100 may include other regions, such as a memory cell region (e.g., a DRAM cell region, SRAM cell region, embedded DRAM cell region, or the like), a memory array region (e.g., a DRAM memory array region, SRAM memory array region, embedded DRAM memory array, or the like), mixed signal/radio frequency circuitry, a core or logic region, or the like, represented generally in FIG. 1 by circuitry 103. It should also be noted that there may be a plurality of input/output regions 212 and pad regions 214 formed in the semiconductor die 100, although only one of each is shown for illustrative purposes.

The substrate 210 may comprise bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate, may also be used.

Figure 2:
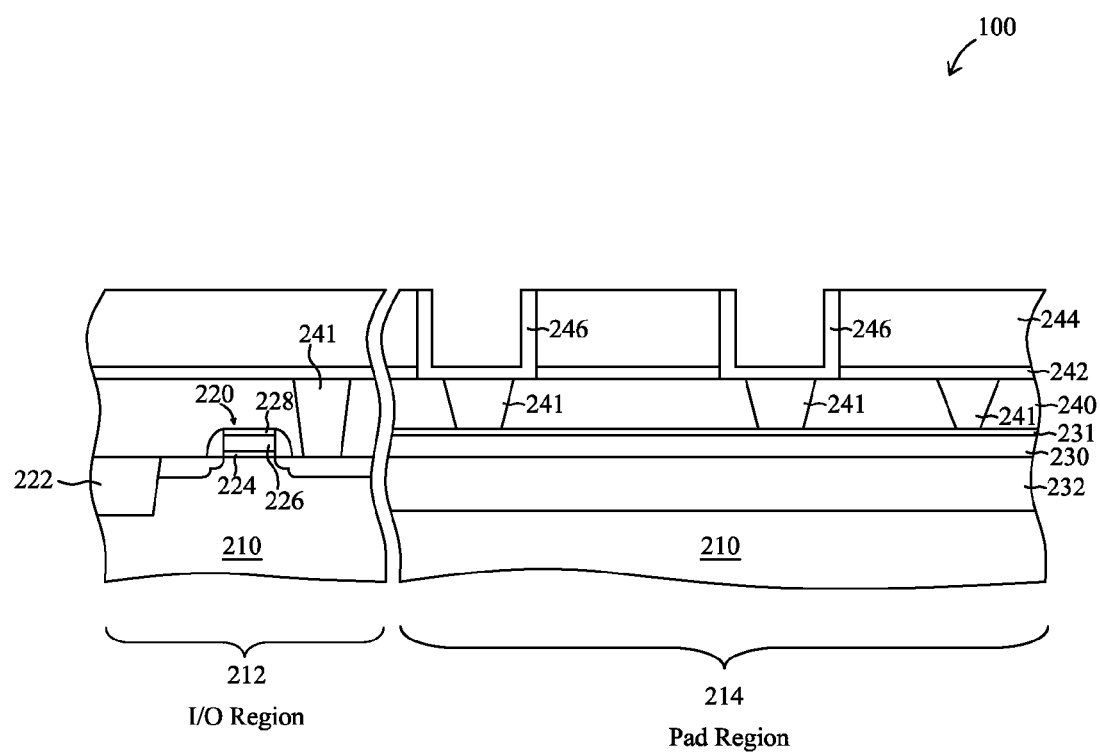
FIGS. 2-5 illustrate intermediate steps of a method of forming a semiconductor device utilizing MIM capacitors under the contact pad in accordance with an embodiment of the present invention.

In an embodiment, the input/output region 212 includes one or more semiconductor devices and various circuit components and isolation regions. For example, the input/output region 212 may include a transistor 220 and a shallow trench isolation (STI) 222 as illustrated in FIG. 2. The STI 222 may be formed by utilizing photolithography techniques to pattern and etch the substrate 210 to form trenches, which may subsequently be filled with a dielectric material, such as silicon dioxide, a high-density plasma (HDP) oxide, or the like.

The transistor 220 comprises a gate dielectric 224 and a gate electrode 226 formed on the substrate 210. The gate dielectric 224 is preferably a high-K dielectric material, such as silicon oxide, silicon oxynitride, silicon nitride, an oxide, a nitrogen-containing oxide, a combination thereof, or the like. Other examples of such materials include aluminum oxide, lanthanum oxide, hafnium oxide, zirconium oxide, hafnium oxynitride, or combinations thereof.

In an embodiment in which the gate dielectric 224 comprises an oxide layer, the gate dielectric 224 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor.

The gate electrode 226 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon).

The surface of the gate electrode 226 may include a silicide layer 228 to reduce the contact resistance between the gate electrode 226 and an overlying contact via (not shown). The salicide layer 228 may be formed by depositing a metallic layer, such as a nickel or cobalt layer, and annealing. The annealing causes the metal to react with the gate electrode, thereby reducing the contact resistance. The un-reacted metallic layer may be subsequently removed.

As illustrated in FIG. 2, the pad region 214 comprises a conductive layer 230 formed over an STI 232. The STI 232 and the conductive layer 230 of the pad region 214 may be formed simultaneously with the same materials and using the same processes as the STI 222 and the gate electrode 226, respectively, of the input/output region 212. A silicide layer 231 may be formed over a surface of the conductive layer 230 in the same manner as the silicide layer 228 in the input/output region 212. As will be discussed in greater detail below, the conductive layer 230 will interconnect bottom electrodes of overlying capacitors formed in subsequent processing steps.

A first insulating layer 240 is formed over the substrate 210. The first insulating layer 240 may comprise an oxide or other dielectric material. For example, in an embodiment, the first insulating layer 240 may comprise $SiO_2$, borophosphosilicate glass (BPSG), TEOS, spin on glass (SOG), undoped silicate glass (USG), fluorinated silicate glass (FSG), high-density plasma (HDP) oxide, or plasma-enhanced TEOS (PE-TEOS), as examples, deposited in a thickness of about ~3,000 Å to about 13,000 Å, for example. A planarization process, such as a chemical-mechanical polish (CMP) process, may be performed to planarize the first insulating layer 240.

The first insulating layer 240 is patterned with a pattern for first contact plugs, and then a conductive material is deposited in the pattern to form first contact plugs 241 to make electrical connection to underlying electrical components. For example, the first contact plug 241 in the input/output region 212 provides an electrical connection to the source/drain region of the transistor 220. In the pad region 214, the first contact plugs 241 are electrically coupled to the conductive layer 230.

The first contact plugs 241 may be formed with a conductive material such as tungsten, or other metals, as examples. Optionally, a conductive barrier layer, such as TiN, TaN, W, or the like, may be formed over the first insulating layer 240 prior to depositing the contact plug material. Excessive amounts of the conductive material may be removed from the top surface of the first insulating layer 240 using a planarization process, such as a CMP process.

A first etch stop layer 242 is deposited or formed over the first insulating layer 240, as shown. The first etch stop layer 242 may comprise a thickness of about 300 Å to about 1,200 Å and may comprise a nitride such as $Si_3N_4$, SiC, SiON, TiN, or other dielectric materials, as examples.

A second insulating layer 244, which may comprise an oxide, a low dielectric constant material, or a similar dielectric material as used for the first insulating layer 240, is deposited over the first etch stop layer 242, as shown in FIG. 2. Alternatively, the second insulating layer 244 may comprise other insulating materials. In an embodiment, the second insulating layer 244 comprises a thickness of about 1,000 Å to about 5,000 Å, for example.

The second insulating layer 244 and the first etch stop layer 242 are patterned for one or more MIM capacitors (formed in subsequent processing steps described below) in the pad region 214. After openings are formed in the second insulating layer 244, lower capacitor electrodes 246 are formed within the openings such that each of the lower capacitor electrodes 246 is electrically coupled to one or more of the underlying first contact plugs 241, as illustrated in FIG. 2. In an embodiment, lower capacitor electrodes 246 are formed by blanket depositing a conductive material and then performing a planarization process to remove the conductive material from an upper surface of the second insulating layer 244, thereby forming the bottom capacitor electrodes as illustrated in FIG. 2. The lower capacitor electrodes 246 may be formed of a metal or metal compound, such as TiN, TaN, ruthenium, or the like, and have a thickness of about 50 Å to about 500 Å.

Figure 3:
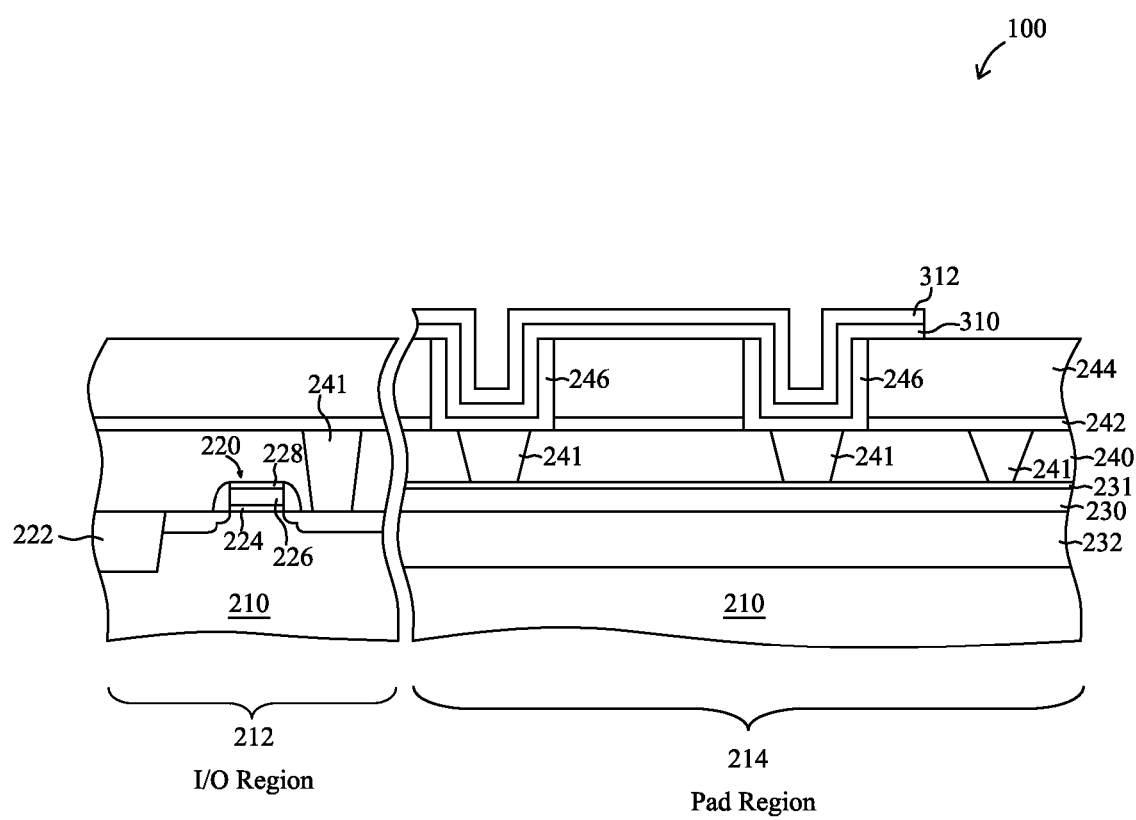

FIG. 3 illustrates depositing a capacitor insulation layer 310 and an upper capacitor electrode 312 in the pad region 214 in accordance with an embodiment. The capacitor insulation layer 310 may be formed of a high-k material such as $TiO_2$, $HfO_2$, $Al_2O_3$, $ZrO_2$, and/or the like. The upper capacitor electrode 312 is formed over the capacitor insulation layer 310 and may be formed of a metal or metal compound, such as TiN, TaN, ruthenium, or the like. In an embodiment, the capacitor insulation layer 310 has a thickness of about 10 Å to about 100 Å, and the upper capacitor electrode 312 has a thickness of about 50 Å to about 500 Å.

Figure 4:
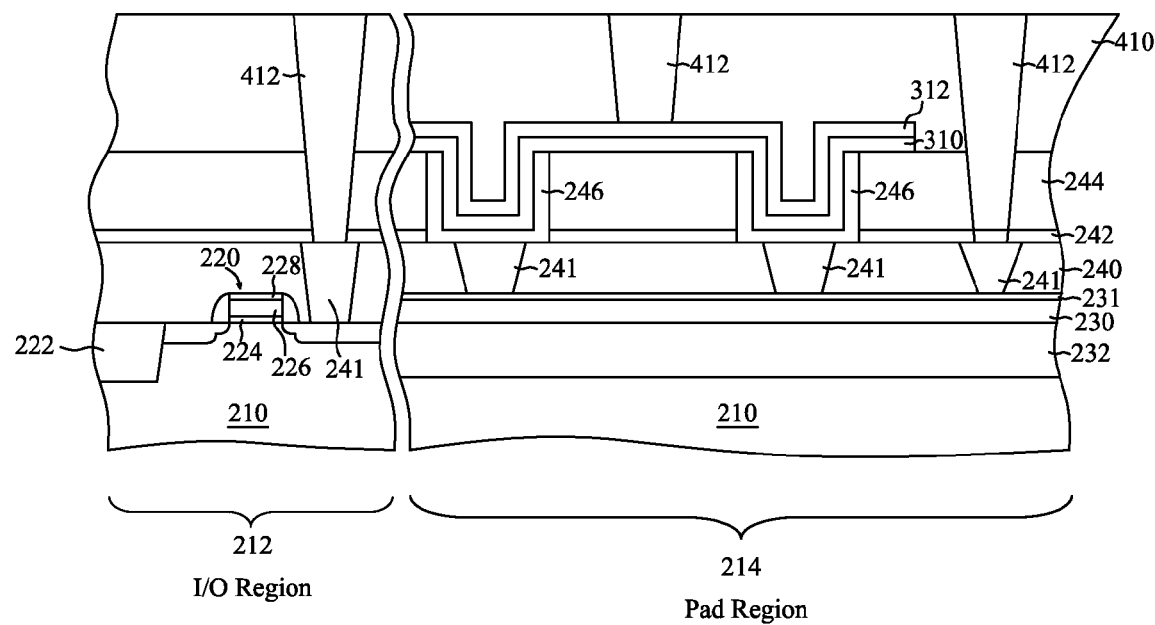

FIG. 4 illustrates the formation of a third insulating layer 410 in accordance with an embodiment of the present invention. The third insulating layer 410, which may comprise an oxide, a low dielectric constant material, or a similar dielectric material as used for the first insulating layer 240 and the second insulating layer 244, is deposited over the upper capacitor electrode 312 and the second insulating layer 244, as shown in FIG. 4. Alternatively, the third insulating layer 410 may comprise other insulating materials. In an embodiment, the third insulating layer 410 comprises a thickness of about 1,000 Å to about 5,000 Å, for example. It should be noted due to the surface topography prior to forming the third insulating layer 410, it may be desirable to perform a planarization process, such as a CMP process, to planarize the third insulating layer 410.

FIG. 4 also illustrates forming second contact plugs 412 to make electrical connections to underlying electrical components. For example, the second contact plug 412 in the input/output region 212 provides an electrical connection to the first contact plug 241, which in turn is electrically coupled to the source/drain region of the transistor 220. Similarly, the rightmost second contact plug 412 in the pad region 214 is electrically coupled to the rightmost first contact plug 241, which in turn is electrically coupled to the conductive layer 230, which in turn is electrically coupled to the lower capacitor electrodes 246. The leftmost second contact plug 412 in the pad region 214 provides an electrical connection to the upper capacitor electrodes 312.

The second contact plugs 412 may be formed with a conductive material such as tungsten, or other metals, as examples. Optionally, a conductive barrier layer, such as TiN, TaN, W, or the like, may be formed prior to depositing the contact plug material. Excessive amounts of the conductive material may be removed from the top surface of the third insulating layer 410 using a planarization process, such as a CMP process.

Figure 5:
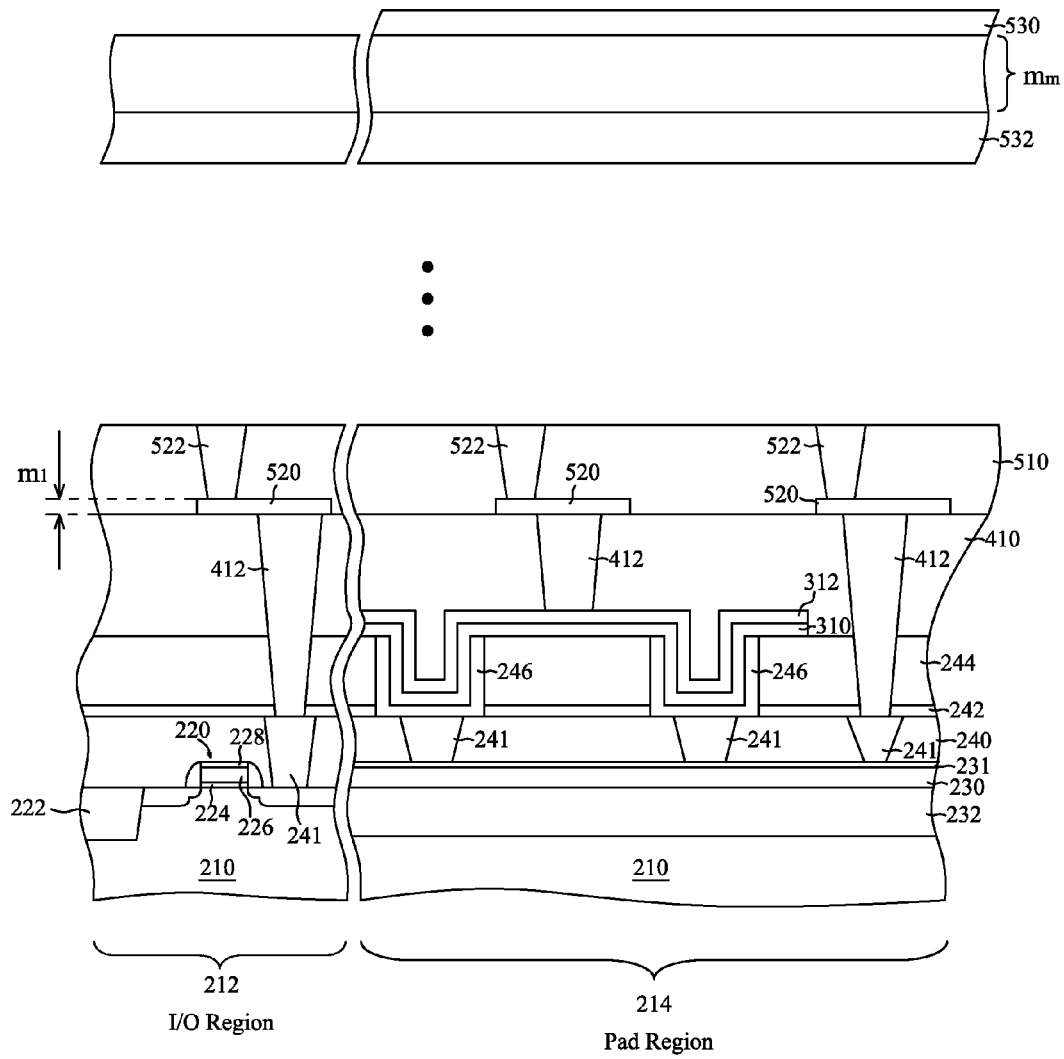

FIG. 5 illustrates formation of one or more metallization layers (e.g., metallization layers M1-Mn) and inter-metal dielectric (IMD) layers interposed therebetween in accordance with an embodiment of the present invention. As shown in FIG. 5, one or more IMD layers 510 and the associated metallization layers M1-Mn are formed over the third insulating layer 410. Generally, the one or more IMD layers 510 and the associated metallization layers M1-Mn are used to interconnect the electrical circuitry (e.g., the transistor 220) and to provide an external electrical connection. The IMD layers 510 are preferably formed of a low-K dielectric material, such as fluorosilicate glass (FSG) formed by PECVD techniques or high-density plasma chemical vapor deposition (HDPCVD) or the like, and may include intermediate etch stop layers, similar to the etch stop layer 242. The metallization layers M1-Mn may be formed of a conductive material, such as Cu, Ti, Al, Ta, combinations thereof, or the like.

For example, FIG. 5 illustrates conductive lines 520 formed over third insulating layer 410. The conductive lines 520 re-route the electrical connection of the underlying second contact plugs 412 at which point third contact plugs 522 are formed through the first IMD layer 510. This process may be repeated throughout the metallization layers to route the electrical connections as desired for a particular design.

Also shown in FIG. 5 is an external contact pad 530. The external contact pad 530 is electrically coupled to the uppermost metal layer Mn, which in turn is electrically coupled to other circuitry (not shown) by a contact via 532. It should be noted that the above-referenced figures are not drawn to scale, and as such, the sizes of the various components may be greater than or less than the other components. In particular, it should be noted that the external contact pad 530 may be substantially larger than illustrated as compared to the MIM capacitors.

One of ordinary skill in the art will realize that embodiments of the present invention provide for MIM capacitors to be placed under the external contact pads. It should be noted that other layers may also be included. For example, other under bump metallization layers and passivation layers may also be formed. MIM decoupling capacitors such as those discussed above may provide a greater capacitance. For example, embodiments implemented in a 40 nm design may achieve 5 fF/cell, or about 85 fF/μm$^2$.

Figure 6:
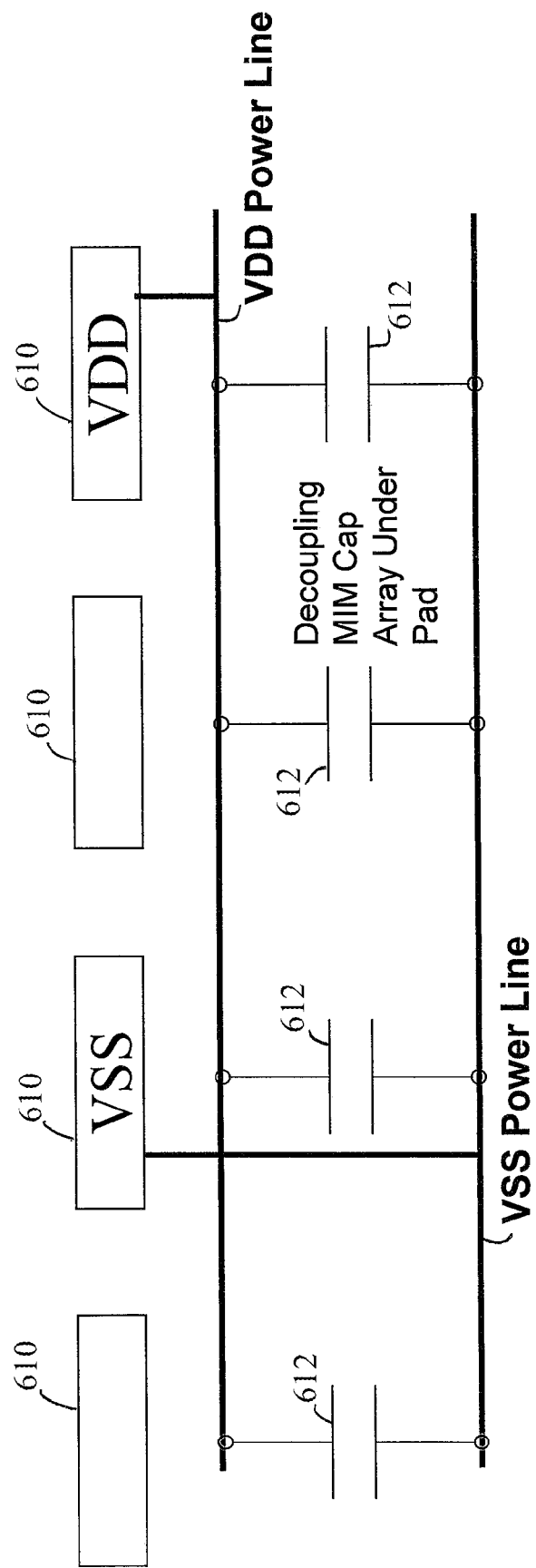
FIG. 6 is a schematic illustrating electrical connections of decoupling MIM capacitors in accordance with an embodiment of the present invention.

This type of configuration may be particularly useful when the MIM capacitors are used as decoupling capacitors electrically coupled between voltage source lines (e.g., $V_{dd}$ and $V_{ss}$) as schematically illustrated in FIG. 6. As illustrated in FIG. 6, arrays of decoupling MIM capacitors 612 (represented in FIG. 6 as a single capacitor) are placed under one or more external contact pads 610. In an embodiment in which the decoupling capacitors 612 are utilized to decouple the $V_{dd}$ and $V_{ss}$ power lines, one plate of the MIM capacitors is electrically coupled to one of the $V_{dd}$ and $V_{ss}$ power lines and the other plate of the MIM capacitors is electrically coupled to the other of the $V_{dd}$ and $V_{ss}$ power lines.

Figure 7:
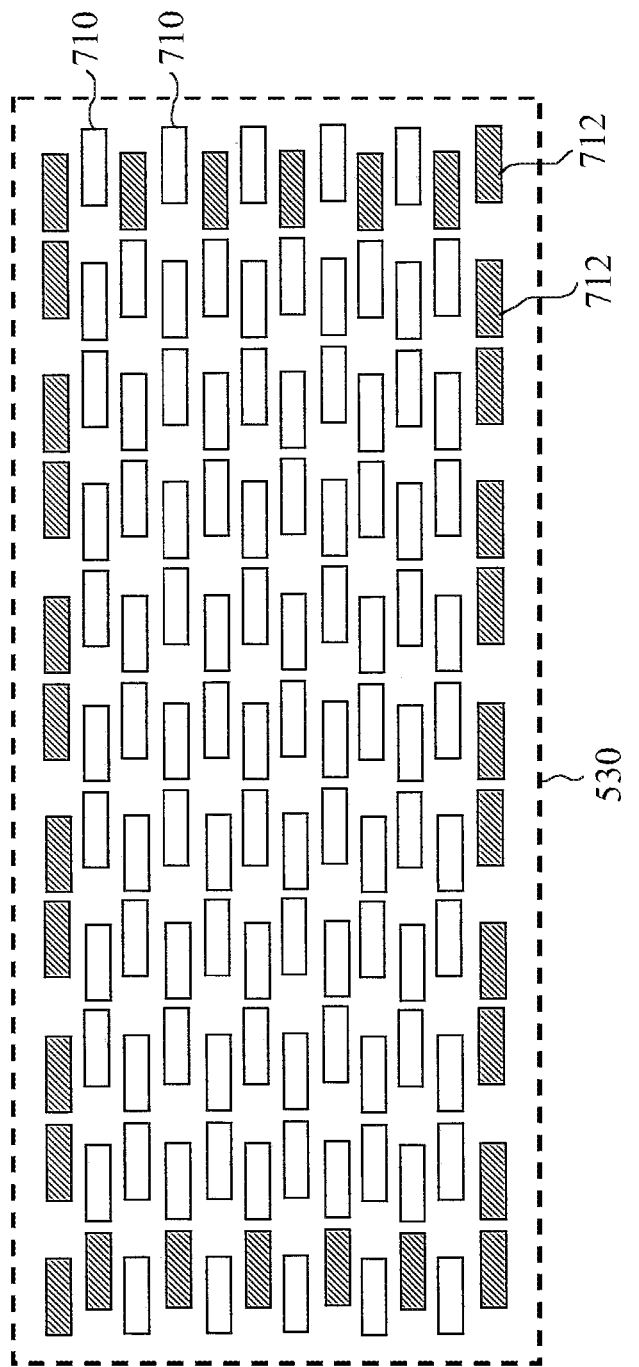
FIG. 7 is a plan view of a decoupling MIM capacitor array in accordance with an embodiment of the present invention.

FIG. 7 illustrates one example of a configuration of a MIM decoupling capacitor array in accordance with an embodiment of the present invention. FIG. 7 illustrates a plurality of effective MIM decoupling capacitors 710 and a plurality of dummy MIM decoupling capacitors 712 that may be placed under the external contact pad 530 (illustrated in FIG. 7 as a dashed rectangle). The dummy MIM decoupling capacitors 712 are not electrically connected, but rather are included to allow for more uniform processes to be performed and to avoid a proximity and loading effect. In an embodiment, the dummy MIM decoupling capacitors 712 may be formed in the same manner as the effective MIM decoupling capacitors 710, except that the first contact via 241 is not present for the dummy MIM decoupling capacitors 712. One of ordinary skill in the art will realize that other patterns/arrangements may be used.

One of ordinary skill in the art will realize that the dummy capacitors located around the outer periphery of the MIM decoupling capacitor array allow similar processing conditions for the effective MIM decoupling capacitors. Accordingly, in an embodiment such as that illustrated in FIG. 7, the dummy capacitors are placed such that either dummy MIM decoupling capacitor or other effective MIM decoupling capacitors are adjacent each side of the effective MIM decoupling capacitors. In this manner, the dummy MIM decoupling capacitors make the outer effective MIM decoupling capacitors have the same surrounding conditions as the inner effective MIM decoupling capacitors.

Figure 8:
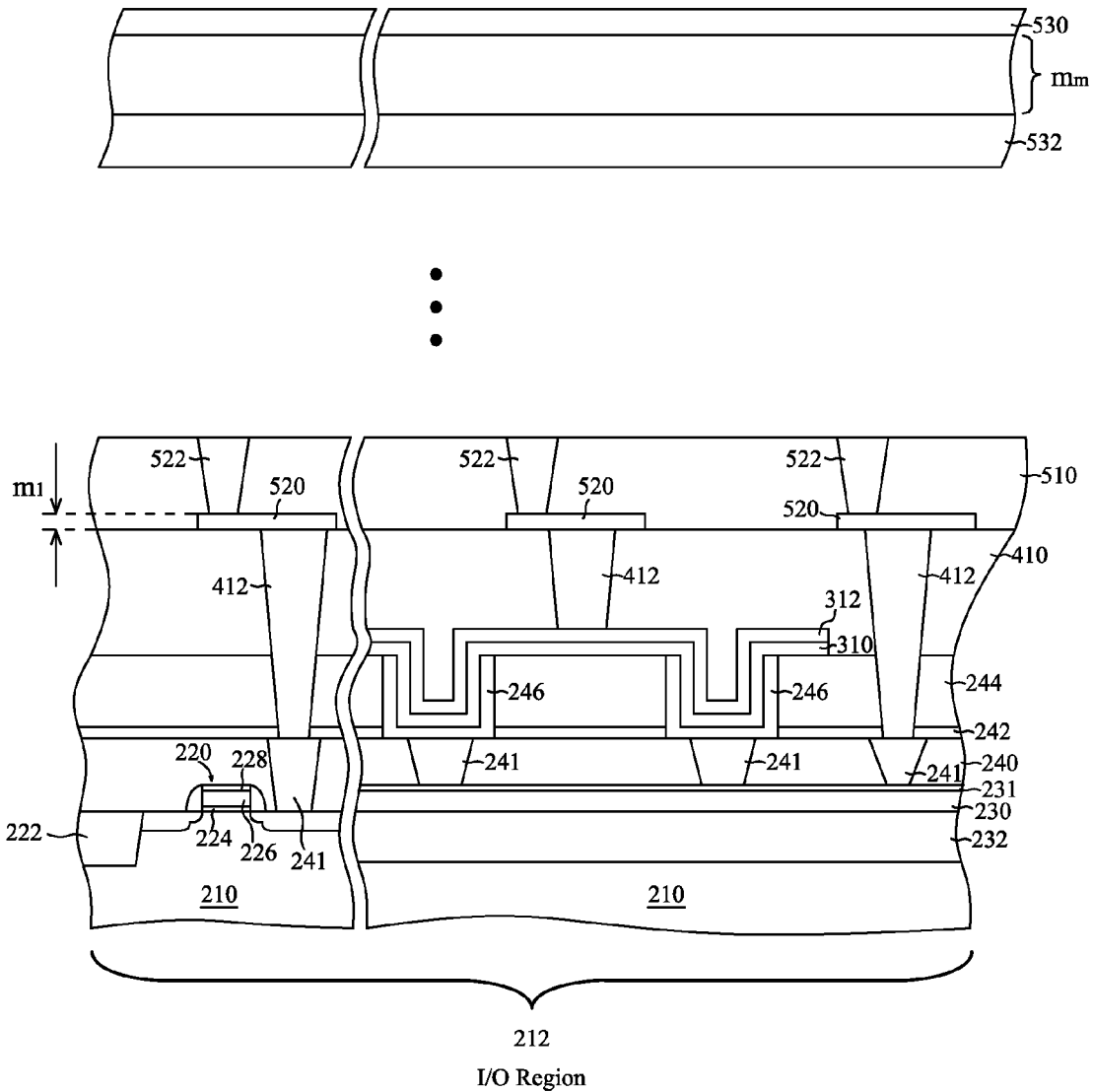
FIG. 8 is a cross-sectional view of decoupling MIM capacitors incorporated into a CUP design in accordance with an embodiment of the present invention.

FIG. 8 illustrates another embodiment in which the MIM decoupling capacitors are added to the input/output region, wherein like reference numerals refer to like elements. The design illustrated above with reference to FIGS. 1-5 represent an embodiment in which a circuit-under-pad (CUP) design is not being used, i.e., a non-CUP design. The embodiment illustrated in FIG. 8, however, illustrates that decoupling MIM capacitors may also be utilized in a CUP design.

In this embodiment, the circuitry in the input/output region 212 is combined with the MIM decoupling capacitors as illustrated in FIG. 8, thereby providing the advantages of utilizing MIM decoupling capacitors in a CUP design. The upper metallization layers, such as the fourth IMD layer to the sixth metallization layer, for example, may be primarily allocated to the external pad configuration, whereas the lower metallization layers, such as the first through the fourth metallization layers, for example, are allocated for the input/output cell connections and the MIM decoupling capacitor connections.

Figure 9:
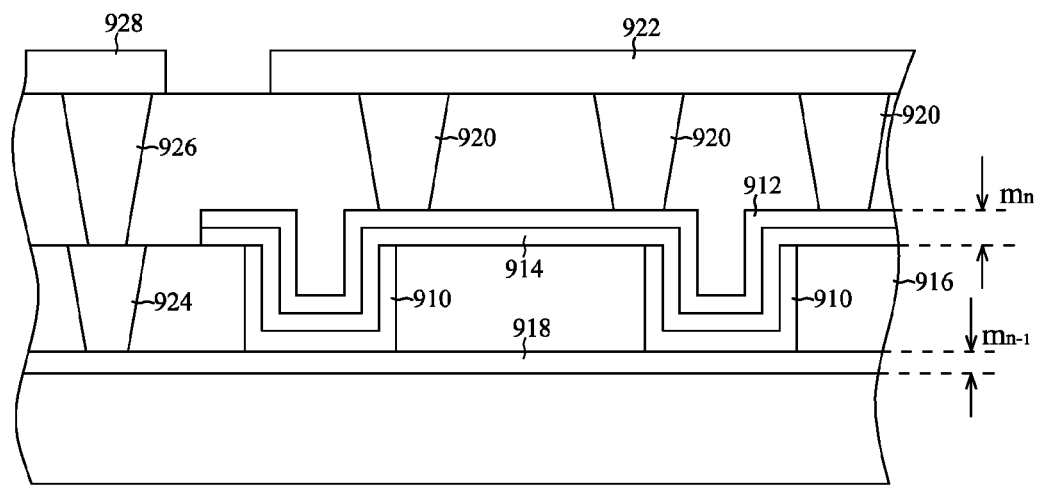
FIG. 9 is a cross-sectional of decoupling MIM capacitors used in an RF circuit design in accordance with an embodiment of the present invention.

FIG. 9 illustrates another embodiment in which MIM decoupling capacitors are placed under an external contact pad. The embodiment illustrated in FIG. 9 may be particularly useful in mixed signal/radio frequency (RF) systems, as well as other system-on-chip (SOC) systems. In an embodiment, the MIM decoupling capacitors provide a capacitance of about 2 fF/μm$^2$. In this embodiment, the MIM decoupling capacitors are located in the uppermost metallization layers. For example, FIG. 9 illustrates a metallization layer $M_n$ and a metallization layer $M_{n-1}$, wherein $M_n$ is the uppermost metallization layer. MIM decoupling capacitors, comprising a lower capacitor electrode 910 and an upper capacitor electrode 912 with a capacitor insulation layer 914 therebetween, are formed in an IMD layer 916. The lower capacitor electrodes 910 are electrically coupled to a conductive line 918 formed in the metallization layer $M_{n-1}$. Vias 920 electrically couple an external contact pad 922 formed directly over the MIM decoupling capacitors. One or more vias 924 (one shown) provide an electrical connection to the conductive line 918 and, hence, the lower capacitor electrode 910. One or more vias 926 (one shown) may provide an electrical connection between the vias 924 and an overlying external contact pad 928. In an embodiment, the external contact pad 922 is electrically coupled to the $V_{ss}$ or $V_{dd}$, and the external contact pad 928 is electrically coupled to the other.

One of ordinary skill in the art will realize that the embodiment illustrated in FIG. 9 may be formed using processes and materials used to form the similar elements of the embodiment discussed above.

Figure 10:
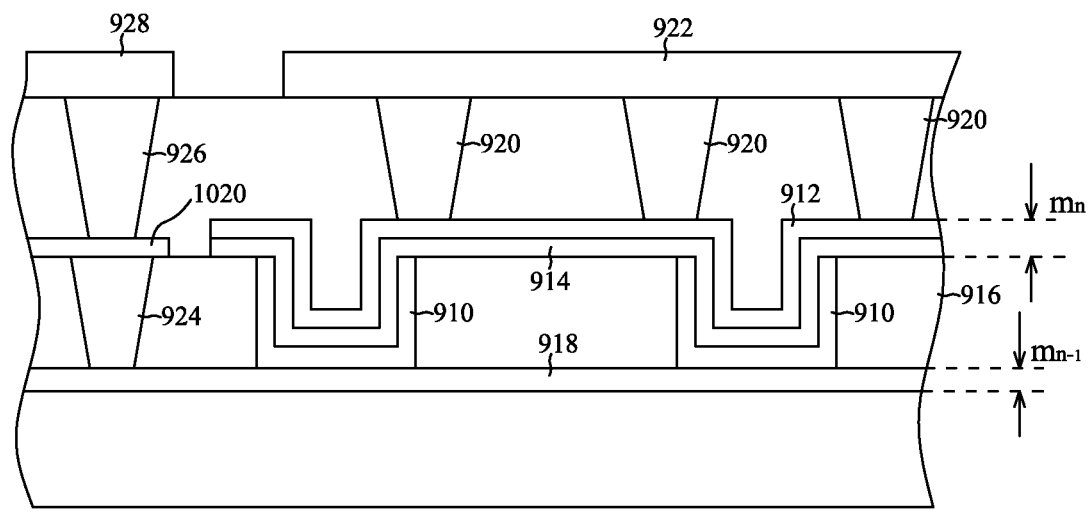
FIG. 10 is a cross-sectional of decoupling MIM capacitors used in an RF circuit design in accordance with another embodiment of the present invention.

It should be noted that various configurations may be used for the embodiments discussed above. For example, vias may make direct contact with an underlying via without the use of an intermediate metal line as illustrated in FIG. 9 between the via 924 and the via 926. In another embodiment, a metal line may be interposed between the via 924 and the via 926, as illustrated by conductive line 1020 in FIG. 10. Similar situations exist with regard to the embodiments illustrated in FIGS. 1-5 and 8, wherein a conductive line may be placed, among other places, between the second contact plugs 412 and the first contact plugs 241.

Figure 11A:
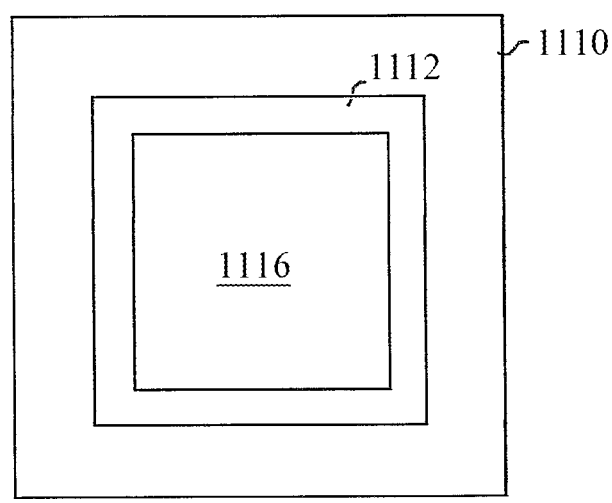
FIGS. 11*a* and 11*b* illustrate a decoupling MIM capacitor in accordance with yet another embodiment of the present invention.
Figure 11B:
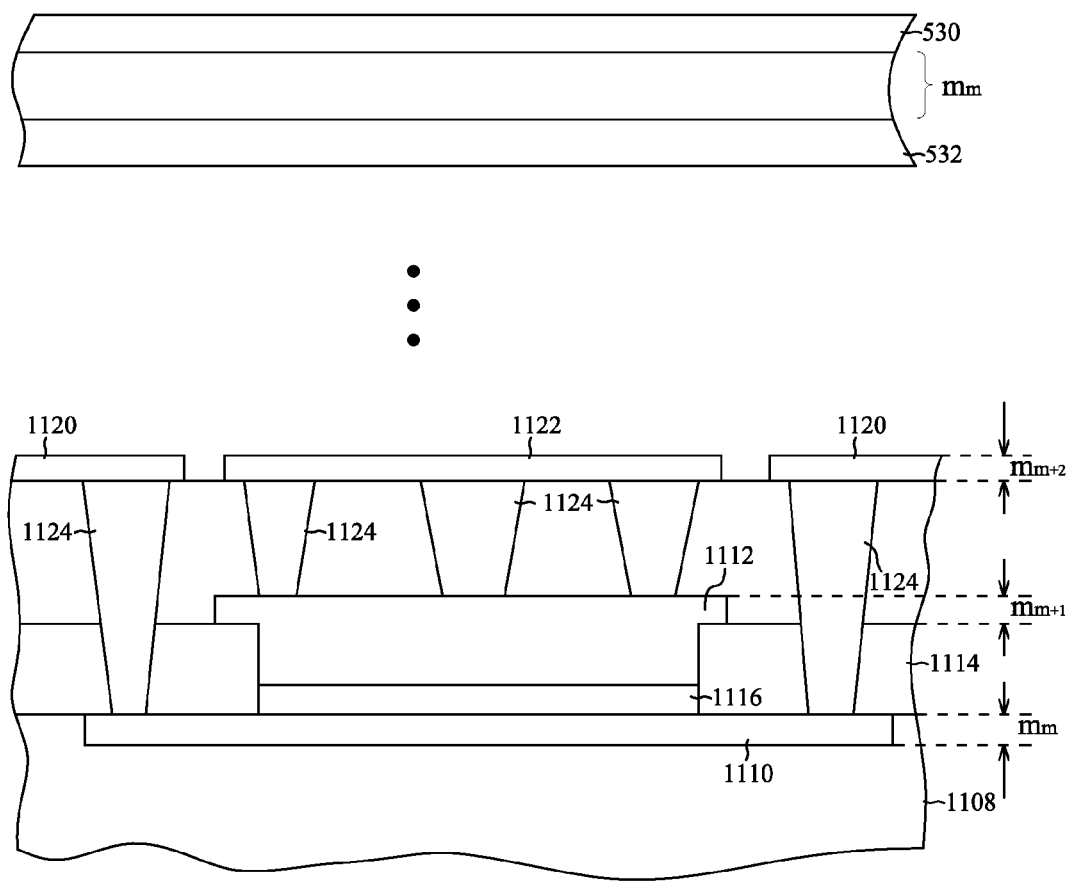

One of ordinary skill in the art will realize that the configurations of the MIM capacitors provided above are provided solely for the purpose of illustration and that other types of MIM capacitors may be used in other embodiments of the present invention. For example, FIG. 11a is a plan view and FIG. 11b is a cross-sectional view of one additional example of a MIM capacitor that may be placed under an external contact pad. In this embodiment, the MIM decoupling capacitors comprise a lower capacitor electrode 1110 formed in a metallization layer $M_n$ in a first intermetal dielectric layer 1108. After forming a second intermetal dielectric layer 1114 over the lower capacitor electrode 1110, an opening may be etched and a high-k dielectric layer 1116 may be formed over a portion of the lower capacitor electrode 1110. An upper capacitor electrode 1112 is formed in a metallization layer $M_{n+1}$ over the high-k dielectric layer 1116, thereby providing a high capacitance between the lower capacitor electrode 1110 and the upper capacitor electrode 1112. A first conductive line 1120 and a second conductive line 1122 may be formed in a metallization layer $M_{n+2}$ and may be electrically coupled to the lower capacitor electrode 1110 and the upper capacitor electrode 1112, respectively, by vias 1124. The vias 1124 may be formed in the same manner as discussed above, and as a single via, as multiple vias directly interconnected with each other, or as multiple vias with interposing conductive lines. In an embodiment, the first conductive line 1120 is electrically coupled to the $V_{dd}$ or $V_{ss}$, and the second conductive line 1122 is electrically coupled to the other one of the $V_{dd}$ and the $V_{ss}$.

Additional intermetal dielectric layers and metallization layers may be formed and an external contact pad may overlie the MIM capacitor. For example, an external contact pad 530 and contact via 532 may be formed as discussed above with reference to FIG. 5.

It should be noted that FIG. 11a illustrates a generally rectangular or square shape for illustrative purposes only, and accordingly, the MIM capacitor may be any shape in accordance with other embodiments of the present invention.

It should also be noted that the MIM capacitor described above with reference to FIGS. 11a and 11b may be formed in any of the metallization layers. For example, the MIM capacitor illustrated in FIGS. 11a and 11b may be formed in the lower metallization layers, the upper metallization layers, or somewhere therebetween.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
a chip having an external contact pad exposed to accept a connection to an external device, the chip having one or more intermetal dielectric layers and one or more metallization layers disposed within the one or more intermetal dielectric layers, the external contact pad disposed over a topmost metallization layer of the one or more metallization layers;
one or more decoupling metal-insulator-metal (MIM) capacitors aligned directly under the external contact pad, the one or more decoupling MIM capacitors being non-planar capacitors;
an insulating layer disposed over topmost surfaces of the one or more decoupling MIM capacitors and under the external contact pad; and
one or more vias disposed in the insulating layer and electrically coupling the external contact pad to at least one of the one or more decoupling MIM capacitors.

2. The integrated circuit structure of claim 1, wherein the one or more decoupling MIM capacitors are formed in an uppermost inter-metal dielectric layer.

3. The integrated circuit structure of claim 1, wherein the one or more decoupling MIM capacitors include one or more dummy MIM capacitors and one or more effective MIM capacitors.

4. The integrated circuit structure of claim 3, wherein a row of the one or more dummy MIM capacitors is positioned along an outer edge of a pattern of the one or more effective MIM capacitors.

5. The integrated circuit structure of claim 1, wherein the chip further comprises a memory array.

6. The integrated circuit structure of claim 1, wherein the chip further comprises mixed signal/radio frequency circuitry.

7. The integrated circuit structure of claim 1, wherein the one or more decoupling MIM capacitors are arranged in a staggered pattern.

8. An integrated circuit structure comprising:
a substrate;
a plurality of dielectric layers formed over the substrate;
a plurality of metallization layers disposed within the plurality of dielectric layers;
one or more effective metal-insulator-metal (MIM) capacitors formed in the plurality of dielectric layers, a first plate of the one or more effective MIM capacitors being electrically coupled to one of Vss or Vdd, a second plate of the one or more effective MIM capacitors being electrically coupled to the other one of Vss and Vdd;
an external contact pad formed over a topmost metallization layer of the plurality of metallization layers and aligned over the one or more effective MIM capacitors; and
one or more dummy MIM capacitors aligned directly under the external contact pad.

9. The integrated circuit structure of claim 8, wherein at least one of a first plate and a second plate of the one or more dummy MIM capacitors is not electrically coupled to either Vss or Vdd.

10. The integrated circuit structure of claim 9, wherein the one or more dummy MIM capacitors include at least a row of dummy MIM capacitors arranged along a periphery of the one or more effective MIM capacitors.

11. The integrated circuit structure of claim 8, wherein the one or more effective MIM capacitors are formed below a first metallization layer.

12. The integrated circuit structure of claim 8, wherein top electrodes of the one or more effective MIM capacitors are formed in an uppermost metallization layer.

13. The integrated circuit structure of claim 8, wherein the one or more effective MIM capacitors are arranged in staggered rows under the external contact pad.

14. A method of forming an integrated circuit device, the method comprising:
providing a substrate;
forming a plurality of dielectric layers over the substrate;
forming one or more metallization layers, each of the metallization layers being formed between adjacent ones of the plurality of dielectric layers;
forming a plurality of effective decoupling capacitors in at least one of the plurality of dielectric layers, each of the plurality of effective decoupling capacitors being a metal-insulator-metal (MIM) capacitor; and
forming an external contact pad above the topmost metallization layer and aligned directly over the plurality of effective decoupling capacitors, the external contact pad exposed to accept a connection to an external device.

15. The method of claim 14, wherein each of the plurality of effective decoupling capacitors has a top plate electrically coupled to one of Vdd and Vss and a bottom plate electrically coupled to the other of Vdd and Vss.

16. The method of claim 14, further comprising forming a plurality of dummy decoupling capacitors under the external contact pad, each of the plurality of dummy decoupling capacitors being electrically isolated.

17. The method of claim 14, wherein the plurality of effective decoupling capacitors is formed below a first metallization layer of the one or more metallization layers.

18. The method of claim 14, wherein the integrated circuit device comprises an embedded dynamic random access memory (eDRAM).

19. The method of claim 14, wherein the plurality of effective decoupling capacitors is formed in an uppermost inter-metal dielectric (IMD) layer.

20. The method of claim 14, wherein the integrated circuit device comprises mixed signal/radio frequency circuitry.

* * * * *